(12) United States Patent
Lazar

(10) Patent No.: US 6,771,554 B1
(45) Date of Patent: Aug. 3, 2004

(54) ACCESS DELAY TEST CIRCUIT FOR SELF-REFRESHING DRAM

(75) Inventor: Paul S. Lazar, Santa Clara, CA (US)

(73) Assignee: Nanoamp Soutions, Inc, San Jose, CA (US)

(*) Notice: Subject to any disclaimer, the term of this patent is extended or adjusted under 35 U.S.C. 154(b) by 0 days.

(21) Appl. No.: 10/242,284

(22) Filed: Sep. 11, 2002

(51) Int. Cl.[7] .......................... G11C 7/00; G11C 29/00; G11C 8/00
(52) U.S. Cl. .................. 365/222; 365/201; 365/233; 365/233.5
(58) Field of Search ................. 365/222, 194, 365/201, 226, 233, 233.5

(56) References Cited

U.S. PATENT DOCUMENTS

| | | | | |
|---|---|---|---|---|
| 5,856,951 A | * | 1/1999 | Arimoto et al. | ............ 365/226 |
| 6,434,075 B2 | * | 8/2002 | Ooishi | ........................ 365/222 |
| 6,525,984 B2 | * | 2/2003 | Yamagata et al. | .......... 365/226 |
| 6,577,550 B2 | * | 6/2003 | Ito | ............................. 365/222 |

* cited by examiner

Primary Examiner—Trong Phan
(74) Attorney, Agent, or Firm—Patrick T. King

(57) ABSTRACT

An enhanced arbitration and control subsystem for a self-refreshing DRAM has a normal mode of operation and a test mode of operation in which an internal refresh cycle is automatically performed prior to each external access cycle. A first gate is opened in a normal mode of operation to enable internal refresh cycles upon receipt of an internal refresh request signal. The first gate is closed in a test mode to disable any internal refresh requests. A second gate is opened in the test mode of operation to provide a path for an external access request signal to first trigger initiation of an internal refresh cycle prior to an external access cycle. The second gate is closed in a normal mode of operation to allow normal arbitration between internal refresh request signals and external RAS request signals.

15 Claims, 6 Drawing Sheets

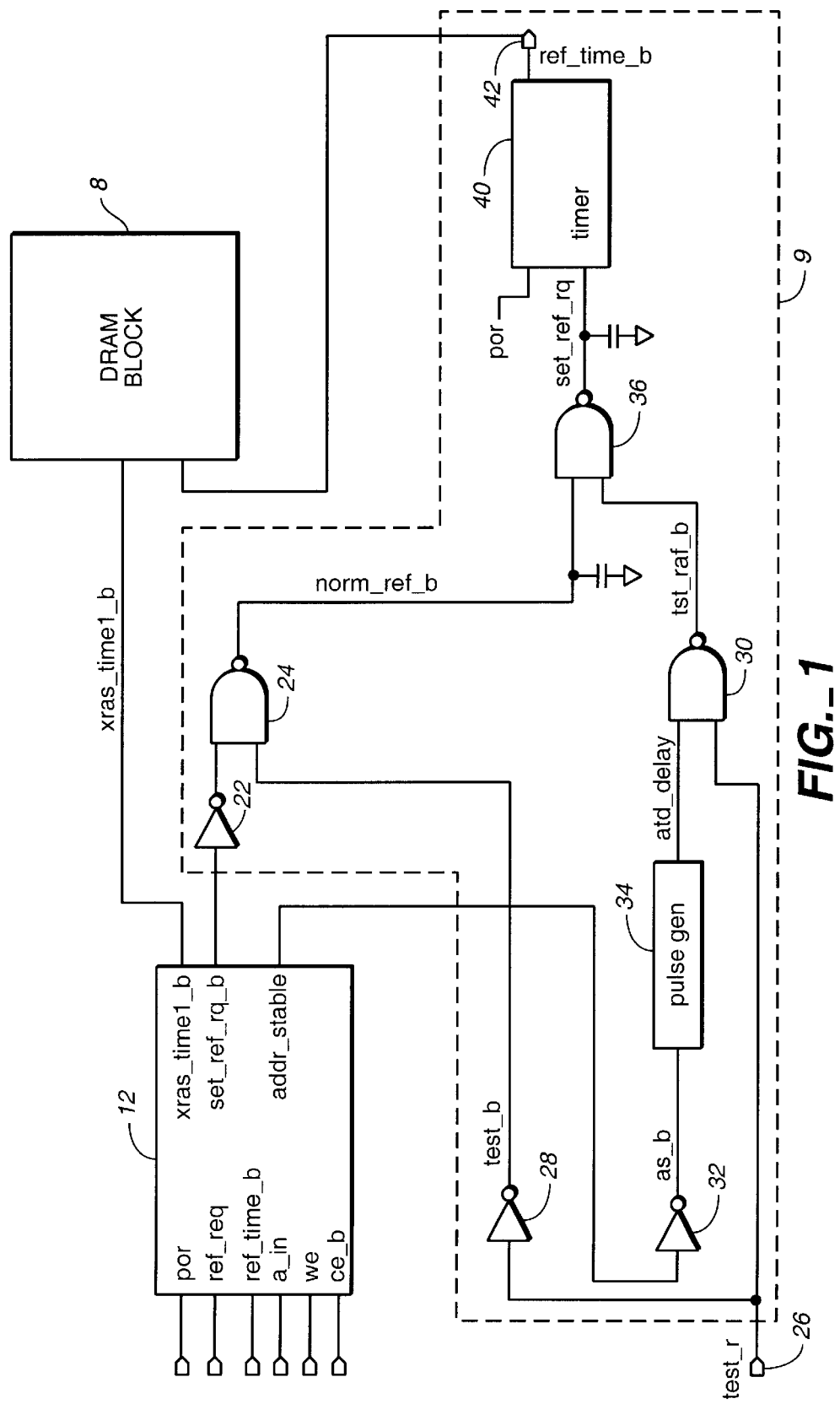
FIG._1

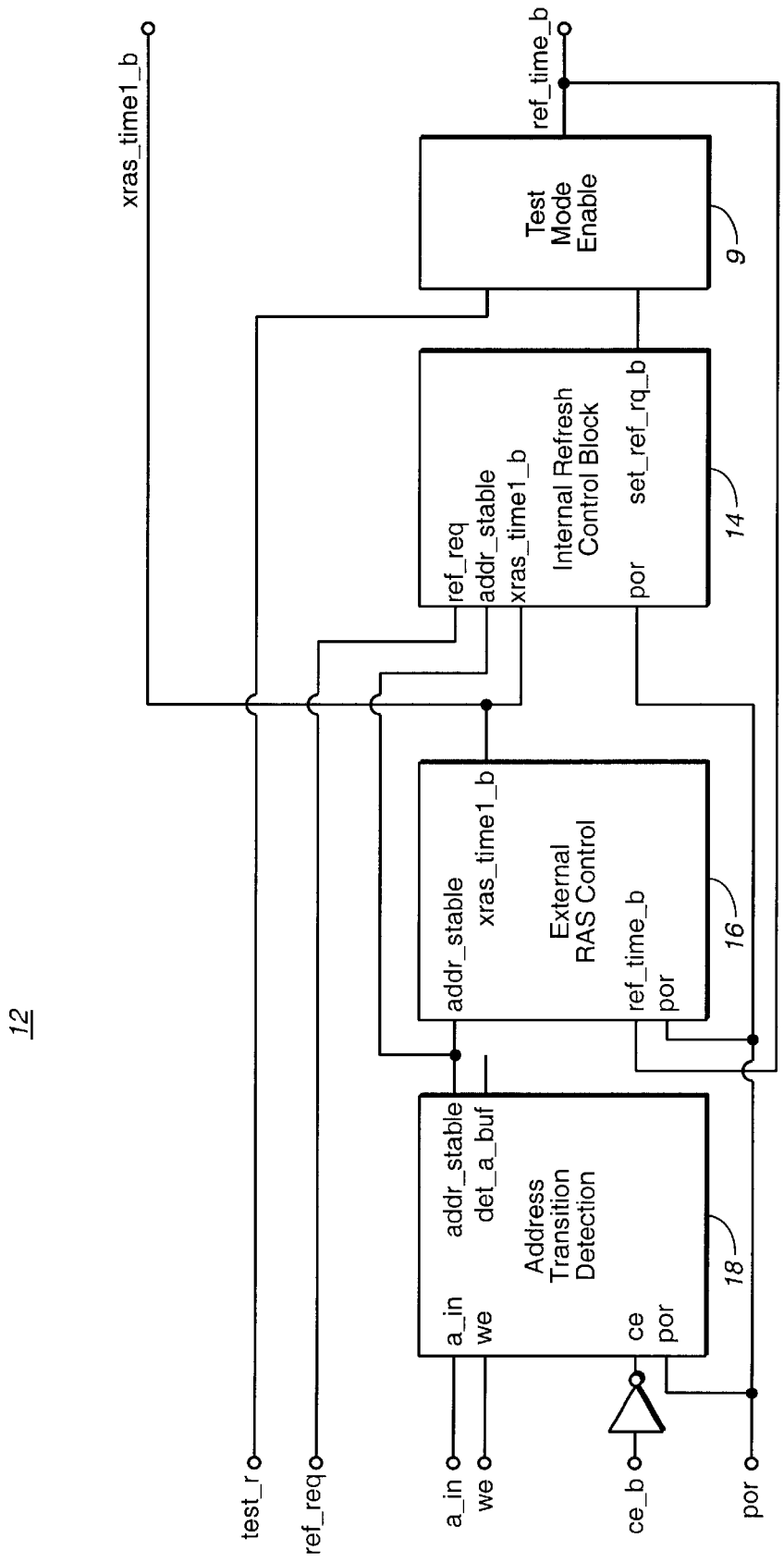
FIG._2

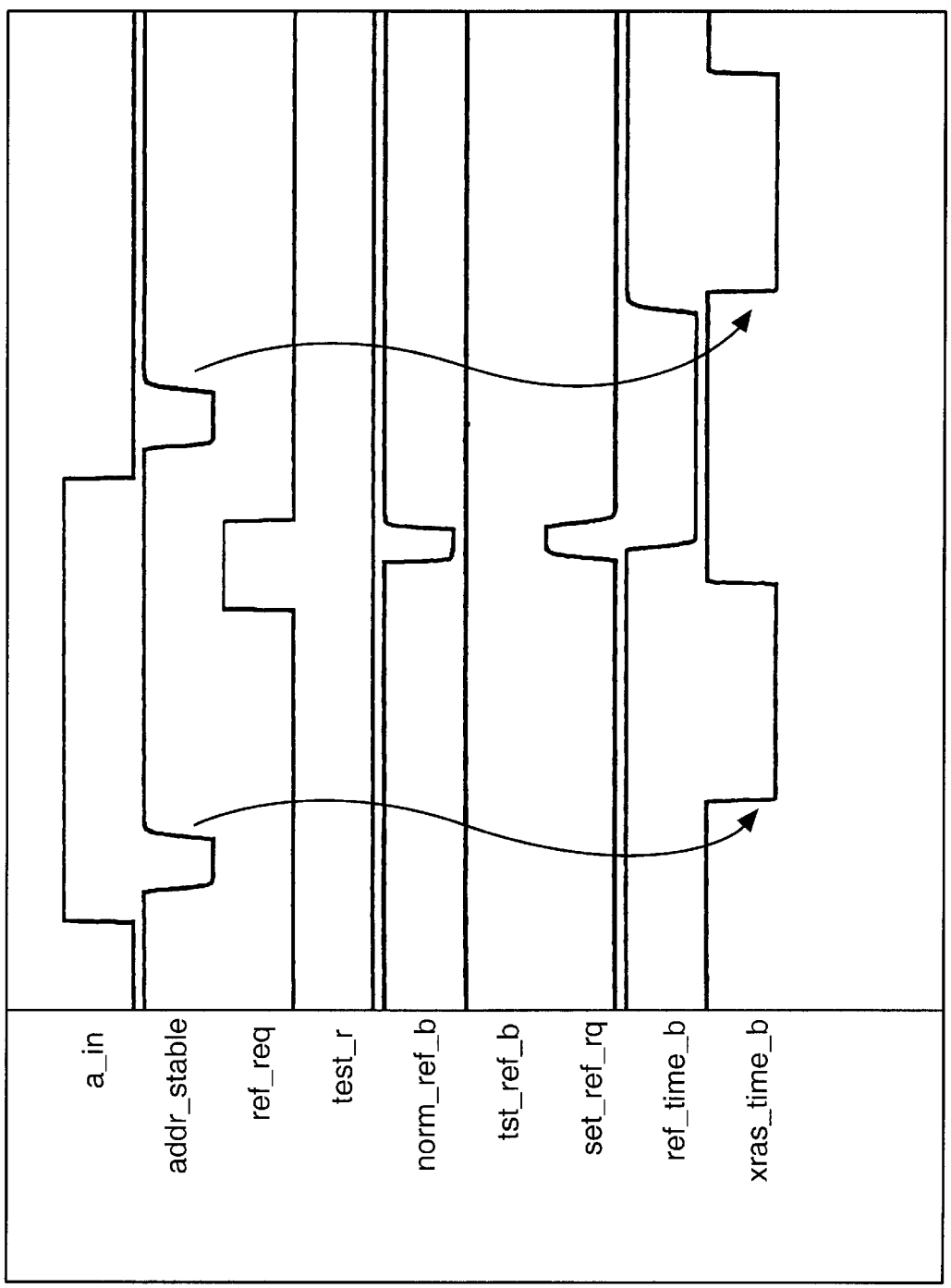
FIG._3

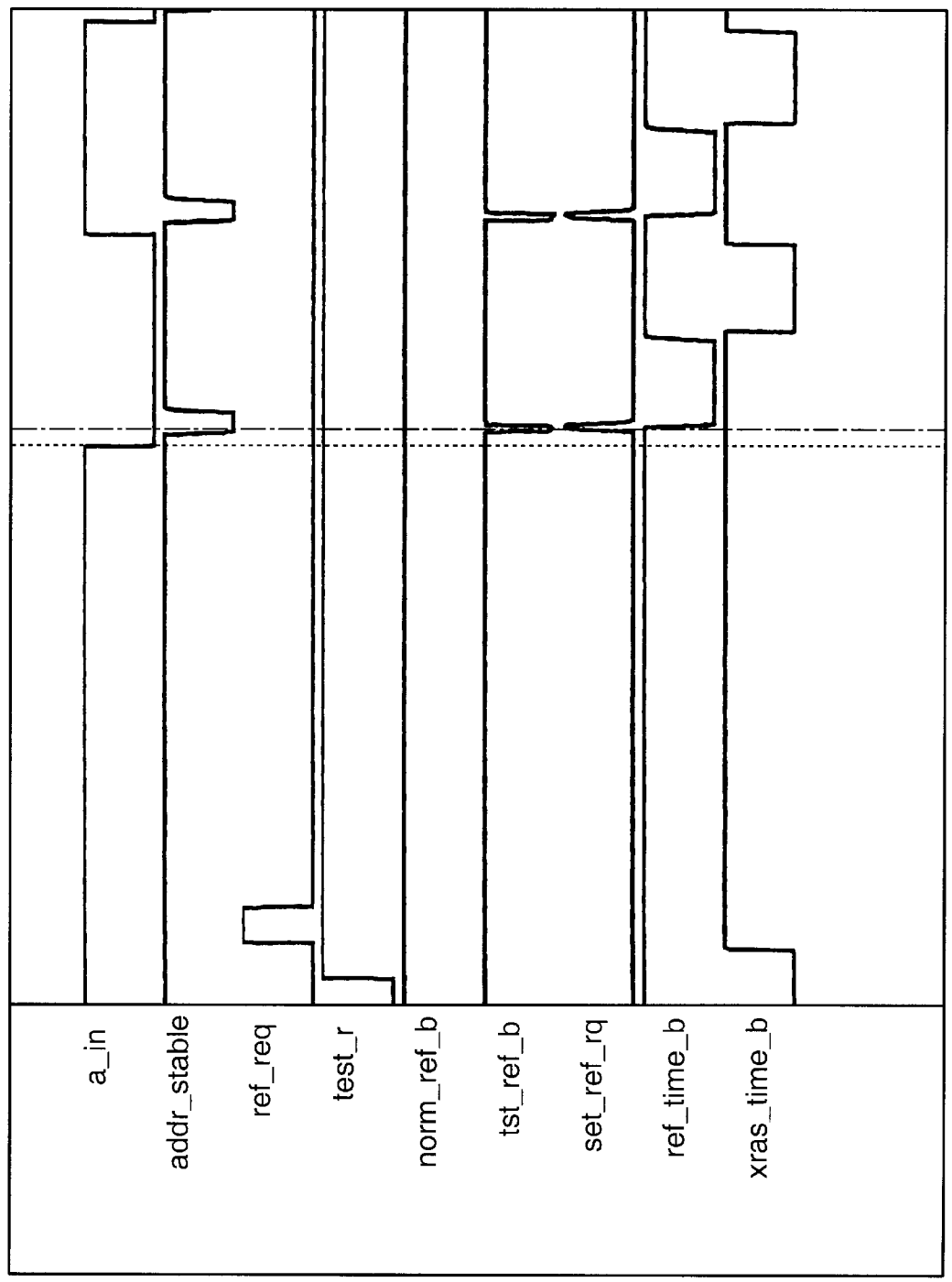
FIG._4

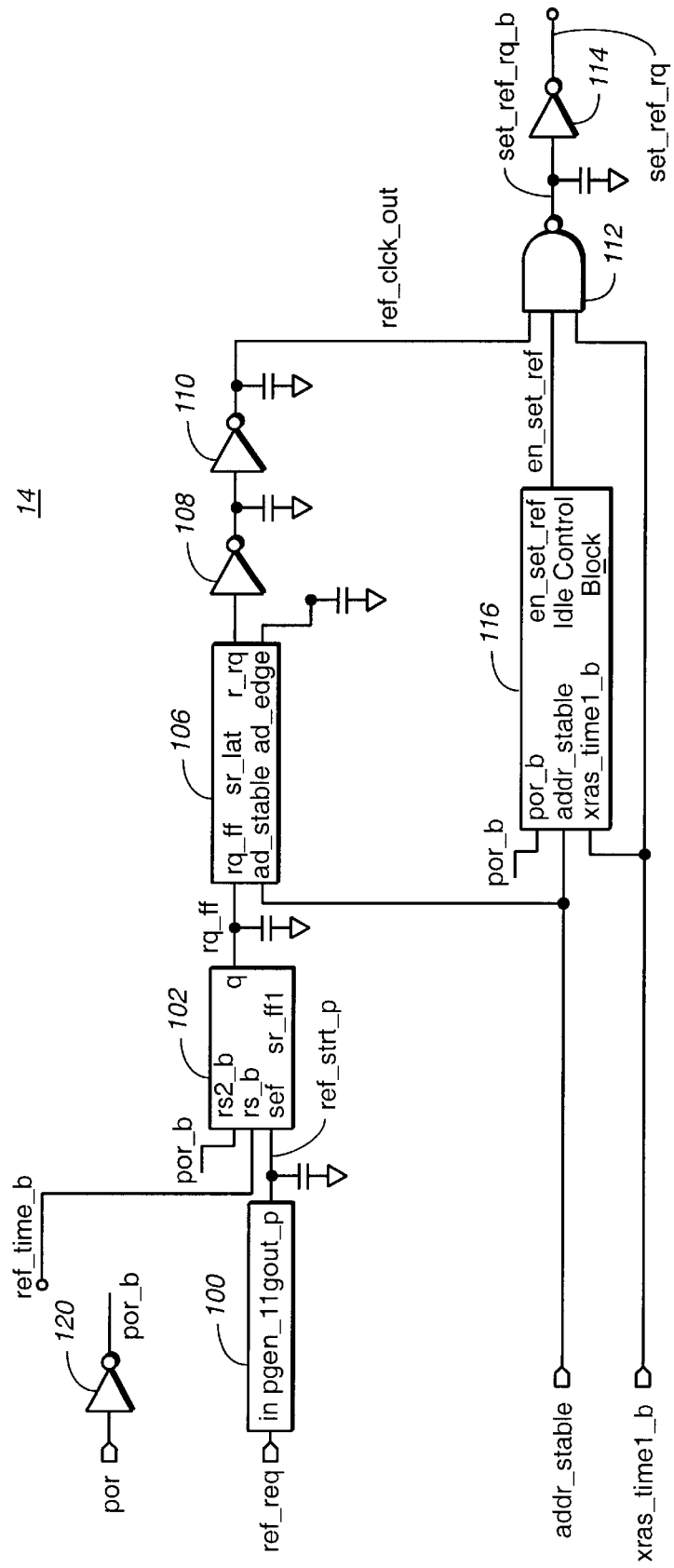
FIG._5

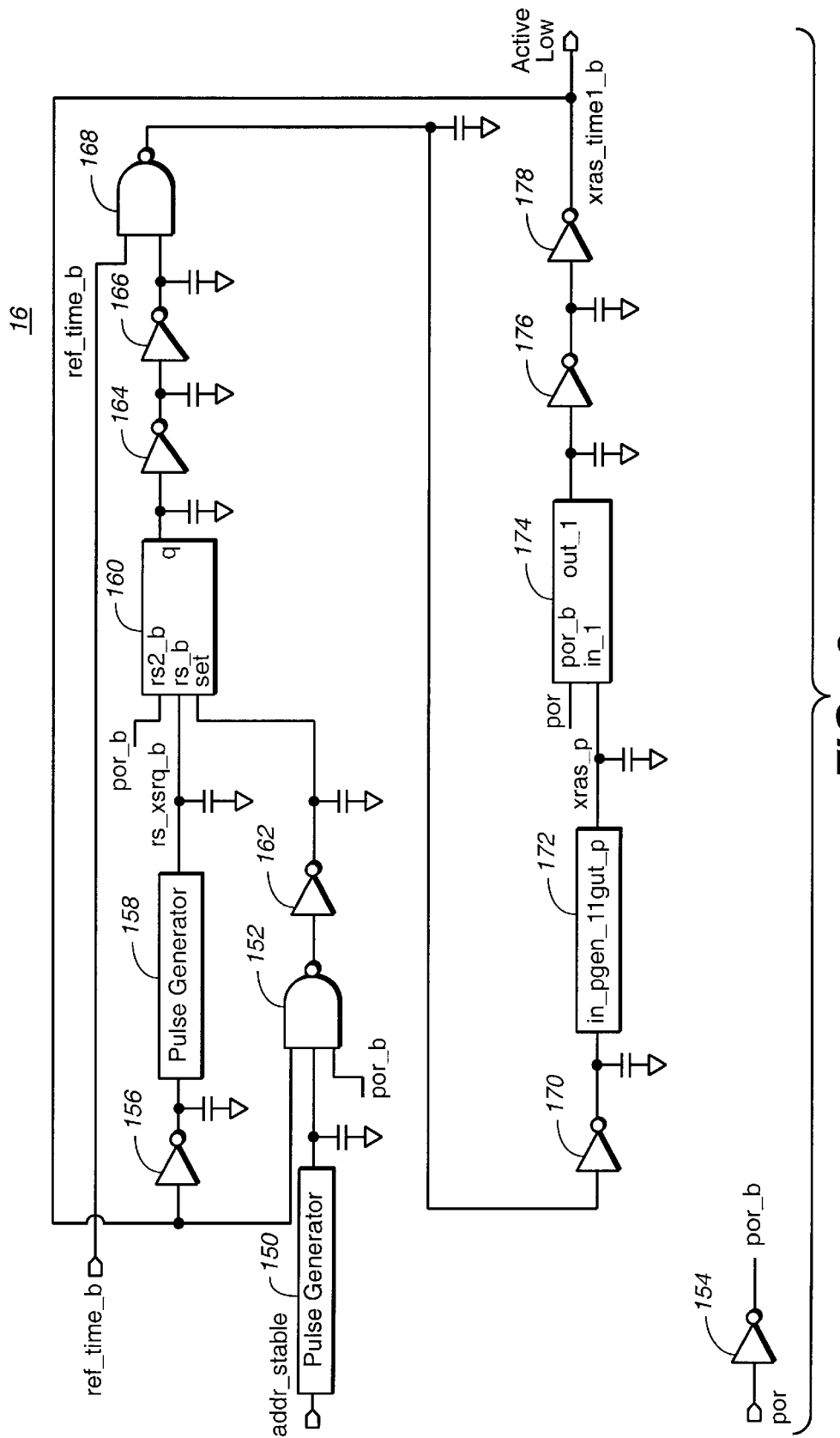
FIG._6

ACCESS DELAY TEST CIRCUIT FOR SELF-REFRESHING DRAM

BACKGROUND OF THE INVENTION

1. Field of the Invention

This invention relates to dynamic random access memories (DRAMs) and, more particularly, to circuits for testing performance of a self-refreshing DRAM.

2. Prior Art

A self-refreshing DRAM has a longer external access time when an external access is requested and an internal self refresh cycle is in progress. An external access cycle cannot be started until an internal self refresh cycle is completed.

Consequently, a need exists for a technique to measure worst-case external access time for a DRAM.

SUMMARY OF THE INVENTION

The present invention provides an access delay test circuit for a self-refreshing DRAM. Self-refreshing DRAMS have External Access Cycles for reading in and writing out external data in specific rows of the DRAM. Self-refreshing DRAMS also include internal refresh cycles that periodically refresh the memory cells in each row of the DRAM. The present invention provides a delay time prior to an external access cycle. Delay times access when an ongoing internal refresh cycle must be completed before an external access cycle can be started. The present invention provides a normal mode of operation and a test mode of operation that always starts an internal refresh cycle prior to initiation of execution of an external access cycle. The invention provides that, during the test mode of operation, the signal, which normally starts an external refresh cycle, is disabled by control logic so that no internal refresh cycles are initiated by a request signal for an internal refresh cycle. In the test mode of operation, upon receipt of an external access request, an address transition detector circuit sends a stable address transition addr_stable signal to the control logic which immediately initiates an internal refresh cycle and delays initiation of an external access cycle. In the test mode, an internal refresh cycle is always started first and is completed prior to initiation of execution of the external access cycle. Consequently, the present invention provides a technique for readily testing performance of a DRAM when an external access cycle is always maximally delayed by initiation of an internal refresh cycle before an external access cycle is initiated.

An arbitration and control system having a test mode that provides an access-delay test circuit for a self-refresh DRAM includes an address transition detection block that receives an address transition signal a_in and that provides an addr_stable output signal to indicate that an address transition has occurred and that a new address is stable. A refresh control block receives an internal refresh request signal ref_req signal, the addr_stable signal, and a row-address-select xras_time1_b signal and that provides a ref_time_b output signal that initiates an internal refresh of a DRAM row. A RAS control block receives the addr_stable signal and the ref_time_b signal and provides a row-address-select xras_time1_b output signal that selects a DRAM row for an external read or write operation.

The refresh control block further includes means for operating the refresh control block in a normal mode and means for operating the refresh control block in a test mode to disable normal generation of internal refresh cycles and to always provide an internal refresh cycle preceding any external row access select signal.

For both the normal mode and the test mode, the arbitration and control system has an address transition detection block that receives an address transition signal a_in and that provides an addr_stable output signal to indicate that an address transition has occurred and that a new address signal is stable.

The arbitration and control system has an internal refresh control block that receives a refresh request signal ref_req signal, the addr_stable signal, and a row-address-select xras_time1_b signal and that in the normal mode of operation provides a ref_time_b output signal that initiates an internal refresh of a DRAM row.

The arbitration and control system has a RAS control block that in both modes of operation receives the addr_stable signal and the ref_time_b signal and that provides a row-address-select xras_time1_b output signal that selects a DRAM row for a read or write operation.

The internal refresh control block includes means for operating the internal refresh control block in a normal mode and means for operating the refresh control block in a test mode to disable normal generation of an internal refresh cycle and to always provide an internal refresh cycle preceding initiation of any external row access cycle.

The means for operating the refresh control block in a test mode disables normal generation of internal refresh cycles. To provide an internal refresh cycle preceding any external row access select cycle, the addr_stable signal going active always triggers a ref_time_b output signal before an xras_time_b output signal to thereby add a worst case delay to initiation of an external row access cycle.

The means for operating the refresh control block in a test mode includes a test terminal for receiving a test_r signal and also includes a first and a second gate. The first gate is closed by an active test_r signal for disabling the output signal of the RAS control box such that no strt_ref_b or set_ref_rq_b signal passes to trigger the ref_time_b output signal. The first gate is opened by an inactive test_r signal enabling the output signal of the RAS control box such that the strt_ref_b or set_ref_rq signal triggers the ref_time_b output signal. The second gate is opened by an active test_r signal to provide a path for an addr_stable signal to trigger a ref_time_b output signal. The second gate is closed by an inactive test_r signal to close the path for an addr_stable signal to trigger an internal refresh ref_time_b output signal.

In the test mode, the leading edge of the addr_stable signal triggers generation of the ref_time_b signal and the trailing edge of the addr_stable signal initiates generation of an xras_time_b signal always after a ref_time_b signal to provide the xras_time_b signal preceded by a ref_time_b signal.

The refresh control block includes an idle control block that provides an output signal when the xras_time1_b signal is inactive and that provides no output signal when the addr_stable signal is active to thereby inhibit the ref_time_b output signal and to prevent initiation of an internal refresh of a DRAM row. A 3-input AND function receives an output signal from the arbitration latch, the output signal from the idle control block, and the xras_time1_b signal such that the output signal of the 3-input AND function triggers a timer circuit that provides the ref_time_b signal.

A refresh timer circuit provides a predetermined active pulse width to the ref_time_b signal to properly time the refresh access duration.

The RAS control block includes a RAS flip-flop circuit that is set by the addr_stable signal and that is reset by the xras_time1_b signal to hold an external RAS cycle request. The RAS flip-flop circuit has an output signal that is gated through a two-input AND gate with an inactive ref_time_b signal.

A RAS timer circuit provides a predetermined active pulse width to the xras_time1_b signal to properly time the duration of an external access to the DRAM memory device.

A method according to the present invention is provided for testing a self-refresh DRAM. The method provides for operating the refresh control block in a normal mode in which internal row refreshing and external row accessing cycles are initiated depending upon their request times. Alternatively operating the refresh control block in a test mode disables normal generation of an internal refresh cycle and always provides that an internal refresh cycle precedes any external row access selection cycle.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a circuit diagram of a control circuit that provides a normal operational mode and also provides a test mode that delays external access to a DRAM by preceding each external access cycle with an internal refresh cycle.

FIG. 2 is a block diagram illustrating an arbitration and control circuit that has an address transition detection block, a refresh control block, and a RAS control block.

FIG. 3 is a timing chart that illustrates various signals for a normal operation of a DRAM.

FIG. 4 is a timing chart that illustrates various signals for a test mode in which a refresh cycle automatically occurs prior to any external access cycle.

FIG. 5 is a block diagram of a refresh control block of FIG. 2.

FIG. 6 is a block diagram of a RAS control block of FIG. 2.

DETAILED DESCRIPTION OF THE PREFERRED EMBODIMENTS

Reference is now made in detail to a preferred embodiment of the invention, an example of which is illustrated in the accompanying drawings. While the invention is described in conjunction with the preferred embodiment, it will be understood that it is not intended to limit the invention to these embodiments. On the contrary, the invention is intended to cover alternatives, modifications and equivalents, which may be included within the spirit and scope of the invention as defined by the appended claims.

FIG. 1 illustrates an enhanced arbitration and control subsystem 10 for a self-refreshing DRAM array that is illustrated as a DRAM array block 8. The memory cells of a DRAM require periodic refresh cycles to restore charge to the cells of a memory row. The arbitration and control subsystem 10 has been enhanced to have a test mode of operation as well as a normal mode of operation. The test mode of operation automatically enables an internal refresh cycle prior to each external access cycle for a DRAM. The test mode provides the greatest delay time for initiation of an external row access select RAS cycle of a self-refreshed DRAM.

The enhanced arbitration and control subsystem 10 includes an arbitration and control block 12 for a self-refreshed DRAM that is disclosed in U.S. patent application Ser. No. 10/174,867, filed Jun. 18, 2002, entitled "DRAM WITH TOTAL SELF REFRESH AND CONTROL CIRCUIT and assigned to the assignee of the present application. U.S. patent application Ser. No. 10/174,867 is incorporated herein by reference.

The enhanced arbitration and control subsystem 10 of FIG. 1 also includes a test mode block 9 of circuitry that provides a test mode of operation that disables normal generation of an internal refresh cycle and that provides an internal refresh cycle preceding any external row-access-select cycle. The test mode block 9 provides an appropriate internal refresh control signal ref_time_b to the DRAM block 8.

FIG. 2 shows the basic arbitration and control block 12 having an internal refresh control block 14, an external RAS control block 16, and an input external address transition detection block 18. The address transition detection block 18 has DRAM input terminals for receiving a power-on reset (por) signal, a write-enable (we) signal, a chip-enable (ce) signal that is provided as an inverted ce signal called ce_b, and an address-input (a_) signal. An external RAS access occurs whenever the address-input a_in signal changes state (either from LOW to HIGH or from HIGH to LOW) and whenever the we signal or the ce signal changes state from an unasserted state to an asserted state. When an external access occurs, the address transition detection block 18 generates output signals called an address-stable (addr_stable) output signal and an address detection det_a_buf signal. Note that typically the a_in signal does not change state unless ce is asserted. The address detection det_a_buf signal is a short pulse indicating that an address transition has taken place. The addr_stable signal is a longer pulse indicating that an address transition has occurred and that the address is stable. If another address transition occurs while the addr_stable signal is being asserted, the duration of the addr_stable pulse signal is extended.

The internal refresh control block 14 has input terminals for receiving a power-on reset (por) signal, a refresh request (ref_req) signal, the addr_stable signal from the address transition detection block 18, and an xras_time_1_b output signal from the RAS control block 16. The input refresh request ref_req input signal is generated by an oscillator and is asserted to indicate that an internal refresh cycle is required. The refresh control block 14 generates a refresh request ref_time_b output signal.

With reference to FIG. 1, the arbitration and control block 12 provides an xras_time_b output signal at an output terminal 20 to the DRAM 8. A set_ref_rq_b signal is passed through an inverter 22 to one input terminal of a first 2-input NAND gate 24. A test_r signal is provided at an input terminal 26 and through an inverter 28 to provide an inverted test input signal test_b to the other input terminal of the 2-input NAND gate 24. The test_r signal is also applied to one input terminal of a second 2-input NAND gate 30. The addr_stable signal is applied through an inverter 32 to provide an inverted addr_stable signal called as_b to an input terminal of a pulse generator 34 to provide an output signal atd_delay at an output terminal, which is connected to the other input terminal of the second 2-input NAND gate 30. An output terminal of the second 2-input NAND gate 30 provides an output signal tst_raf_b and is connected to one input terminal of another 2-input NAND gate 36. An output signal norm_ref_b at an output terminal of the 2-input NAND gate 24 is connected to another input terminal of the 2 input NAND gate 36. An output signal setd_ref_rq at an output terminal of the 2-input NAND gate 36 is connected to a trigger input terminal of a refresh timer circuit 40 that provides an internal refresh control ref_time_b output signal at an output terminal 42.

In the normal mode of operation, if an internal refresh is required, the input refresh requested signal ref_req goes HIGH and the arbitration and control block 12 generates the signal strt_ref_b. When the test_r input signal is LOW, the strt_ref_b generates a normal refresh norm_ref_b output signal. The norm_ref_b signal then starts the timer 40 to provide the ref_time_b output signal at output terminal 42 to the DRAM 8. If an external access occurs while the refresh cycle is in progress, it is delayed until the internal refresh cycle completes.

In order to test the access time for a DRAM for the case in which initiation of an external access cycle is delayed due to current operation of a refresh cycle, the test mode signal test_r is provided. When the test_r signal is HIGH, the test mode is invoked. In this mode, signal norm_ref_b is disabled by being held HIGH by the test_b signal.

When an external access cycle is initiated with the addr_stable signal going LOW, the leading edge of the addr_stable signal triggers a pulse from a pulse generator 34. The pulse is enabled by test_r to pass through the NAND gate 30 to provide a tst_ref_b signal, which starts a refresh cycle by the triggering the timer 40 to generate the refresh control signal ref_time_b.

Since signal norm_ref_b is disabled by the test_r signal being HIGH, any refresh requests initiated by the ref_req input signal and the resulting strt_ref_b output signal do not pass through the NAND gate 24 and are disabled. The waveforms corresponding to the test mode are shown in FIG. 3, and illustrate that a refresh cycle occurs prior to any external access cycle and correspondingly delays the initiation of an external access cycle.

FIG. 3 is a timing chart that illustrates relationships between various signals for normal mode of operation. These signals include input address transition signal a_in; the stable input address signal addr_stable; the refresh request input signal ref_req; the test mode signal test_r; the normal refresh signal norm_ref; the inverted test signal test_b; the timer trigger signal set_ref_b; the internal refresh control signal ref_time_b; and the external access control signal xras_time_b in the normal mode, the test_r signal remains LOW and the inverted test signal test_b is HIGH which allows the NAND gate to pass input signals. The test_ref_b signal is HIGH which blocks signals from passing through the NAND gate 30.

A first change in the state of input address signals provides an a_in signal, which triggers an active-LOW addr_stable signal. The positive-going edge of the addr_stable signal triggers the active-LOW xras_time_b signal to initiate an external access cycle. After the xras_time_b signal goes inactive-HIGH, an active-HIGH internal refresh request ref_req signal produces an active-LOW norm_ref_b signal which is inverted to provide a timer trigger set_re_rq signal to trigger the timer 40 to produce an active-LOW ref_time_b output signal at terminal 42. A second change in the state of input address signals provides a_in signal, which triggers another active-LOW addr_stable signal. The positive-going edge of the addr_stable signal then triggers the active-LOW xras_time_b signal to initiate another external access cycle after the ref_time_b goes inactive-HIGH again. In the normal mode of operation, it is apparent that it would be difficult to find the worst-case delay for initiation of an external access cycle because of the lack of synchronization between address changes and the refresh request oscillator. Using the test mode of operation allows each external access cycle to be delayed by a maximum delay produced by an internal refresh cycle starting immediately after an addr_stable signal is received.

FIG. 4 is a timing chart that illustrates the various signals of FIG. 3 for a test mode of operation in which a refresh cycle automatically occurs prior to any external access cycle. In the test mode of operation, the NAND gate 24 is disabled so that the signals resulting from any ref_req input signal are blocked. In the test mode of operation, the NAND gate 30 is activated so that the leading edge of the positive inverted addr_stable signal called as_b triggers the pulse generator 34 to provide an atd_delay signal, which provides the tst_ref_b signal to the timer 40 through the gate 36. The timer 40 provides an active-LOW output signal ref_time_b to initiate an internal refresh cycle. The active-LOW state of the ref_time_b signal inhibits the xras_time_b signal that controls the start of an external RAS cycle. After the ref_time_b signal goes inactive, the ref_time_b signal immediately initiates an external RAS cycle. In this way, the test mode of operation always precedes an external access cycle with an internal refresh cycle to provide a test operation for testing maximum access time delay.

FIG. 5 is a more detailed block diagram of the refresh control block 14 of FIG. 2. The ref_req signal is fed to an input terminal of a pulse generator 100 that is triggered on a positive edge to provide an output refresh start pulse ref_strt_p to a set input terminal of an RS flip-flop circuit 102. A first reset input terminal of the RS flip-flop circuit 102 receives a ref_time_b input signal that is fed back from an output terminal 42 of the refresh timer circuit 40 of FIG. 1. connected to the output terminal 42 the refresh control block 14. A second reset input terminal of the RS flip-flop circuit 102 receives the power-on reset por_b signal. The q output terminal of the RS flip-flop 102 has an output signal rq_ff that is applied to one input terminal of an arbitration latch 106. The addr_stable input signal from the address transition detection circuit 18 of FIG. 1 is applied to the other input terminal of the arbitration latch 106. The output terminal of the arbitration latch 106 is applied through two inverters 108, 110 to provide a refresh acknowledge ref_ack_out signal that is applied to one input terminal of a 3-input NAND gate 112. The NAND gate 112 has a set_ref_rq_b signal at an output terminal that is connected through an inverter 114 to provide an AND function and the set_ref_rq output signal from the arbitration and control block 12 of FIG. 1.

The addr_stable input signal is also applied to a first input terminal of an idle control block 116. The xras_time1_b output signal of the RAS CONTROL block 16 is applied to a second input terminal of the idle control block. The por_b signal is also applied to an input terminal of the idle control block 116. An active-LOW output signal en_set_ref of the idle control block 116 is applied to a third input terminal of the 3-input NAND gate 112.

The output signal set_ref_rq of the AND function is provided by an output signal set_ref_ref_rq_b of the 3-input NAND gate 112 through the inverter 114.

The RS flip-flop circuit 102 is set whenever the ref_req signal goes HIGH and is reset by the ref_time_b signal at the start of execution of a refresh access. The RS flip-flop 102 stores a refresh request and provides a HIGH level at its output terminal until the start of execution of a refresh access. Storage of the refresh request is initiated with the pulse generator 100. Reset of the RS flip-flop 102 is accomplished when the ref_time_b signal goes LOW at the start of a refresh access cycle.

The arbitration latch 106 arbitrates between a refresh cycle request and an external access cycle request. Its output signals r_rq and ad_edge are normally LOW because the rq_ff input signal is normally LOW and the addr_stable input signal is normally HIGH.

An inverter 120 inverts a power-on_reset signal por into an inverted por_b signal. The inverted por_b signal resets the circuits 102 and 116. The por signal resets circuit 104.

With reference to FIG. 5, the addr_stable signal is also fed into the idle-control block 116, such that, when the addr_stable signal goes LOW, the output signal en-set-ref of the idle_control block 116 is reset LOW to thereby disable propagation of the ref_ack_out signal through the AND gate formed by the NAND gate 112 and the inverter 114. As a result, in the normal mode of operation, any address change that causes the addr_stable signal to go LOW to indicate an external access effectively blocks any refresh cycle from occurring until the addr_stable signal times out and goes back HIGH. Note that the rising edge of the addr_stable signal starts an external access cycle using the RAS control block 14 of FIG. 2.

FIG. 6 shows the details of the RAS control block 16 of FIG. 2. The active-LOW addr_stable signal is fed to an input terminal of a pulse generator 150 that is triggered on a positive-going edge to provide an output pulse to one input terminal of a 3-input NAND gate 152. The xras_time1_b output signal of the RAS control block 16 is fed back to a second input terminal of the 3-input NAND gate 152. The third input terminal of the 3-input NAND gate 152 also receives a power-on reset por_b signal. The por signal is inverted in an inverter 154 to provide the inverted por_b signal. The fed_back xras_time1_b signal is also passed through an inverter 156 to an input terminal of a positive-edge triggered pulse generator 158 that has an output signal rs xsrq b that is fed to an inverted reset input terminal rs b of a RS flip-flop 160. The por b signal is connected also to a second reset terminal rs2 b of the RS flip-flop 160. The set input terminal of the flip-flop 160 is connected through an inverter 162 from the output terminal of the 3-input NAND gate 152. The 3-input NAND gate 152 and. the inverter 162 also form an AND gate. The output signal of the RS flip-flop 160 is fed through two inverters 164, 166 to one input terminal of a 2-input NAND gate 168. The other input terminal of the 2-input NAND gate 168 receives the ref_time_b signal from the Refresh Control block of FIG. 2. The output terminal of the 2-input gate 168 is connected to an input terminal of an inverter 170 that provides an AND function in combination with the NAND gate 168. The output signal of the inverter 170 is fed to an input terminal of a positive-edge triggered pulse generator 172 to provide a xras_p output signal to an in 1 input terminal of a RAS timer circuit 174. An out 1 output signal of the ras_timer circuit 174 is fed through fed through two inverters 176, 178 to provide the xras_tim1_b output signal for the RAS control block 16 as previously described, the xras_time1_ signal is fed back to an input terminal of the 3-input NAND gate 152 and also to an input terminal of the inverter 156. The RS flip-flop 160 is reset by the por_signal at a rs2 b input terminal. The ras_timer 174 is reset by the por signal.

With reference to FIG. 6 and in the normal mode of operation, the rising edge of the addr_stable signal triggers the pulse generator 150 to start an external access cycle with the RAS control block 16. At the end of the external access cycle xras_time1_b goes from LOW to HIGH. This causes the idle_control block 116 of the Refresh Control block 14 in FIG. 3 to set its output signal en_set_ref back to a HIGH to thereby enable starting a refresh operation at the end of an external access cycle.

In the normal mode of operation, the refresh request and the addr_stable for signals occur asynchronously with respect to each other. If the addr_stable signal state occurs, or goes LOW, prior to the receipt of the ref_req signal such that the signal ad_edge of FIG. 3 goes HIGH, an external RAS cycle is executed with the circuit of FIG. 3. This occurs when the active LOW state of the addr_stable signal times out and goes HIGH to eventually trigger the xras_time_1b output signal to be asserted as a LOW level. During this time, the refresh cycle provided by FIG. 3 is disabled. When the external RAS cycle ends, as indicated by the xras_time_b signal going HIGH, the en_set_ref signal of FIG. 3 goes HIGH. Since the addr_stable signal has gone HIGH, the r_rq signal is set and the signal set_ref_rq is generated to start the timer 104 such that the signal ref_time_b goes LOW to execute a refresh cycle.

In the test mode of operation, refresh request input signals are ignored. Internal refresh cycles are only executed immediately prior to each external access RAS cycles.

The foregoing descriptions of a specific embodiment of the present invention have been presented for purposes of illustration and description. It is not intended to be exhaustive or to limit the invention to the precise forms disclosed, and obviously many modifications and variations are possible in light of the above teaching. The embodiment was chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. An arbitration and control system having an access-delay test circuit for a self-refresh DRAM, comprising:
    an address transition detection block that receives an address transition signal and that provides an address-stable output signal to indicate that an address transition has occurred and that a new address is stable;
    a refresh control block that receives a refresh request signal, the address-stable signal; and a row-address-select signal and that provides an internal refresh control output signal that initiates an internal refresh of a DRAM row;
    a row access select RAS control block the receives the address-stable signal and the internal refresh control signal and that provides the row-address-select output signal that selects a DRAM row for a read or write operation;
    wherein the refresh control block further includes:
        means for operating the refresh control block in a normal mode of operation and arbitrating between the refresh request signal and the address-stable signal to prioritize refresh cycles and external access cycles for the DRAM; and
        means for operating the refresh control block in a test mode to disable normal generation of an internal refresh cycle and for always providing an internal refresh cycle preceding any external row access select cycle.

2. The arbitration and control system of claim 1 wherein the means for always providing an internal refresh cycle preceding any external row access select signal includes the address stable signal going active to always trigger an external refresh control signal before an external access control signal to thereby provide a delay for an external access cycle.

3. The arbitration and control system of claim 1 wherein the means for operating the refresh control block in a test mode includes:
   a test terminal for receiving a test mode signal;
   a first gate that is closed by an active test mode signal for disabling the output signal of the refresh control block;
   said first gate is opened by an inactive test mode signal enabling the output signal of the refresh control block such that the internal refresh control signal is triggered in the normal mode of operation;
   a second gate that is opened by an active test mode signal to provide a path for the address-stable signal to trigger a refresh control output signal prior to triggering an external access control signal;
   said second gate is closed by an inactive test mode signal to close the path for the address-stable signal to trigger an internal refresh control output signal prior to triggering an external access control signal.

4. The arbitration and control system of claim 1:
   wherein in the test mode of operation the leading edge of the address-stable signal triggers generation of the internal refresh control; and
   wherein in the test mode of operation the trailing edge of the address-stable signal initiates generation of an external access control signal always after first generating an internal refresh control signal to provide the external access control signal preceded by an internal refresh signal.

5. The arbitration and control system of claim 1 wherein the first gate and the second gate are 2-input NAND gates that have their output terminals connected to respective input terminals of another 2-input NAND gate, the output signal of which triggers a refresh timer circuit to provide the internal refresh control signal with a predetermined duration.

6. The arbitration and control system of claim 1 wherein the address transition detection block does not provide an output signal unless a write-enable we or a chip enable ce signal is received by the address transition detection block.

7. The arbitration and control system of claim 1 wherein the refresh control block includes:
   an idle control block that provides an output signal when the external access control signal is inactive and that provides no output signal when the address-stable signal is active to thereby inhibit the internal refresh control output signal and to prevent initiation of an internal refresh of a DRAM row;
   a 3-input AND function that receives an output signal from an arbitration latch, the output signal from the idle control block, and the external access control signal such that the output signal of the 3-input AND function triggers a timer circuit that provides the internal refresh control signal.

8. The arbitration and control system of claim 1 wherein the refresh control block includes a flip-flop circuit that is set by the refresh request signal and reset by the internal refresh control signal to hold a refresh request.

9. The arbitration and control system of claim 1 including a refresh timer circuit that provides a predetermined active pulse width for the internal refresh control.

10. The arbitration and control system of claim 1 wherein the RAS control block includes a RAS flip-flop circuit that is set by the address-stable signal, and that is reset by the external access control signal to hold an external RAS cycle request, and wherein the RAS flip-flop circuit has an output signal that is gated through a two-input AND gate with an inactive internal refresh control signal.

11. The arbitration and control system of claim 10 including a RAS timer circuit that provides a predetermined active pulse width to the external access control signal.

12. A method of testing a self-refresh DRAM, comprising:
   receiving an address transition signal in an address transition detection block and providing an address-stable output signal to indicate that an address transition has occurred and that a new address is stable;
   receiving in a refresh control block a refresh request signal, the address-stable signal, and a row-address-select signal and providing an internal refresh control output signal that initiates an internal refresh of a DRAM row;
   receiving in a RAS control block the address-stable signal and the internal refresh control signal and providing a row-address-select output signal that selects a DRAM row for a read or write operation;
   operating the refresh control block in a normal mode and arbitrating between the refresh request signal and the address-stable signal to prioritize refresh cycles and external access cycles for the DRAM; and
   alternatively operating the refresh control block in a test mode that disables normal generation of an internal refresh cycle and that always provides an internal refresh cycle preceding any external row access select cycle.

13. The method of claim 12 wherein operating the refresh control block in a test mode includes:
   receiving a test mode signal at a test terminal;
   disabling the output signal of the refresh control block with a first gate that is closed by an active test mode signal,
   opening said first gate with an inactive test mode signal to enable an internal refresh control signal from the refresh control block,
   opening a second gate with an active test mode signal to provide a path for an address-stable signal to trigger an internal refresh control prior to triggering an external access control signal;
   closing said second gate with an inactive test mode signal to close the path for an address-stable signal.

14. The method of claim 12 including:
   triggering generation of the internal refresh control signal with the leading edge of the address-stable signal; and
   initiating with the trailing edge of the address-stable signal generation of the external access control signal always after a an internal refresh control signal to provide the external access control signal preceded by the internal refresh control signal.

15. The method of claim 12 including the address transition detection block providing an output signal when a write-enable we or a chip enable ce signal is received by the address transition detection block.

* * * * *